United States Patent [19]

Raney et al.

[11] Patent Number: 5,546,154
[45] Date of Patent: Aug. 13, 1996

[54] PRESSURE DEVELOPER APPARATUS

[75] Inventors: Tommy Raney, Germantown; Julius D. King, Jr., Huber Heights, both of Ohio

[73] Assignee: Cycolor Imaging, Inc., Dayton, Ohio

[21] Appl. No.: 380,385

[22] Filed: Jan. 30, 1995

[51] Int. Cl.$^6$ .................................................. G03D 9/02
[52] U.S. Cl. ........................................ 354/304; 355/326 P
[58] Field of Search ........................... 354/297, 301, 354/304; 355/296 P, 326 M, 326 P; 430/138

[56] References Cited

U.S. PATENT DOCUMENTS

| | | | |
|---|---|---|---|
| 4,648,699 | 3/1987 | Holycross et al. | 430/138 |
| 4,872,032 | 10/1989 | Watanabe et al. | 354/297 |
| 4,884,098 | 11/1989 | Matsumoto | 355/326 P |
| 4,885,601 | 12/1989 | Yui | 354/297 X |
| 4,914,463 | 4/1990 | Yui et al. | 354/304 |

Primary Examiner—D. Rutledge
Attorney, Agent, or Firm—Thompson Hine & Flory P.L.L.

[57] ABSTRACT

A pressure developing apparatus is described for use in developing images in the image area of a photosensitive imaging sheet containing microcapsules, wherein the apparatus comprises:

an arm which oscillates in arcuate paths across the surface of the imaging sheet;

means for oscillating the arm across the surface of the imaging sheet;

means for establishing longitudinal movement between the arm and the imaging sheet; and a developer head positioned along the shaft of the arm, the developer head further containing at least one point contact element which is resiliently biased into contact with a surface of the imaging sheet such that the point contact element traverses the surface of the imaging sheet in sequential increments to provide a plurality of paths and applies uniform pressure sufficient to rupture the microcapsules in substantially the entire image area.

21 Claims, 3 Drawing Sheets

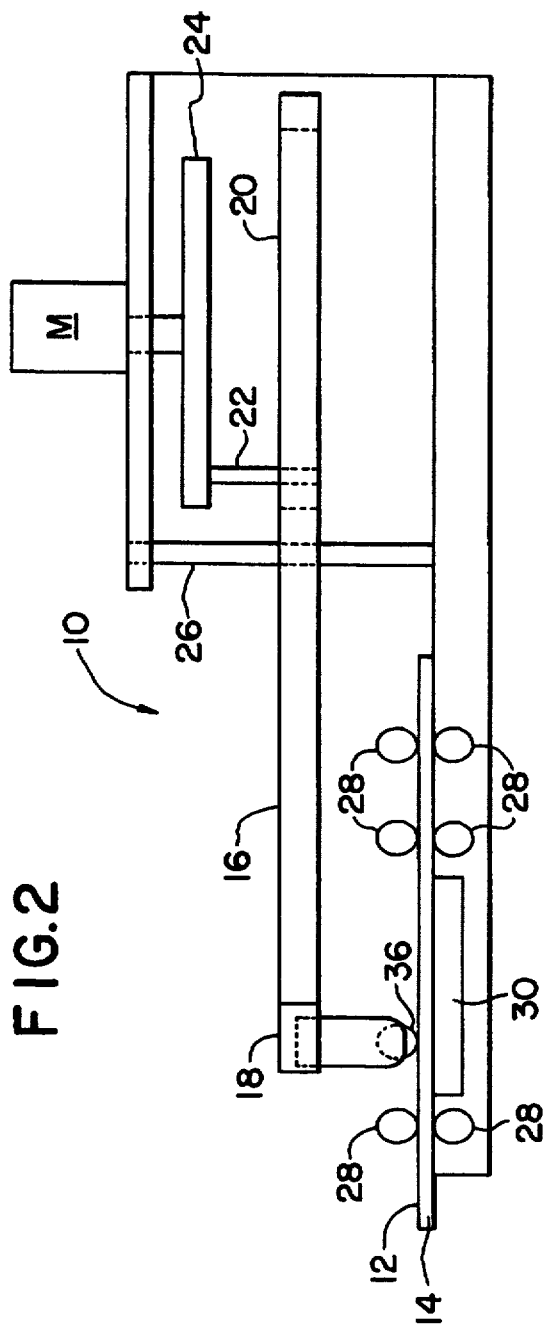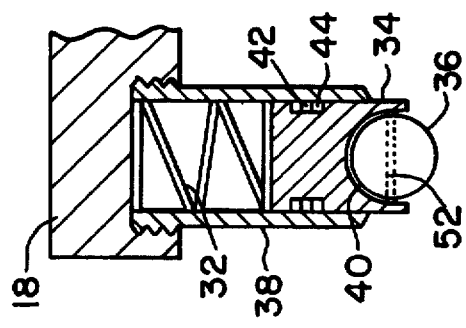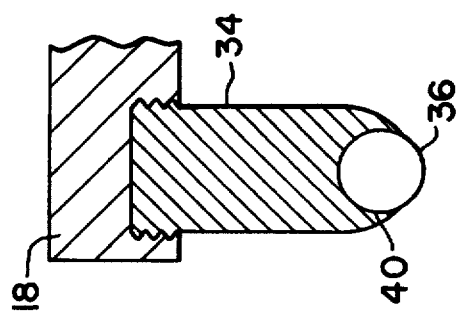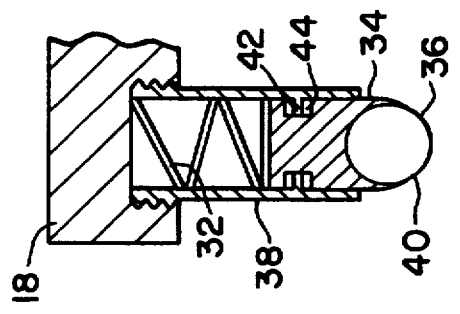

PRESSURE DEVELOPER APPARATUS

BACKGROUND OF THE INVENTION

The present invention relates generally to an imaging system utilizing imaging sheets containing rupturable photosensitive microcapsules and, more particularly, to a tension arm developer apparatus for developing images in contact with the imaging sheet by pressure development using a point contact element in contact with the outer surface of the imaging sheet.

U.S. Pat. Nos. 4,399,209; 4,416,966; 4,440,846; 4,842, 981; 4,865,943; and 4,766,050, all commonly assigned to The Mead Corporation, describe an imaging system wherein a photosensitive layer comprising microcapsules containing a photosensitive composition in the internal phase is image-wise exposed to actinic radiation and subjected to a uniform rupturing force whereupon the microcapsules rupture and image-wise release the internal phase which reacts with a developer material to produce an image therein. The imaging system is particularly advantageous because it is a totally dry system and does not rely upon the application of wet development processing solutions to produce the image. An image forming chromogenic material, such as a substantially colorless color former, is typically associated with the microcapsules. When the microcapsules rupture, the color former image-wise reacts with a developer material and produces a color image. In the embodiments described in the referenced patents, the microcapsules are typically ruptured by passing image-wise exposed imaging sheets through the nip between a pair of calendar rollers.

While heavy pressure is not required to rupture the microcapsules, high pressure and large calender rollers are normally used to develop the imaging sheets. Even carefully machined metal calender rollers have uneven surfaces. If one roller is simply rested upon another, the surfaces of the rollers are not in contact over the entire length of the rollers. By applying pressure to the rollers, the uneven surfaces or surface irregularities are "smoothed out" to provide a uniform contact line between the rollers. The high pressure and large size of the rollers are necessary to achieve a uniform distribution of the rupturing forces across the surface of the imaging sheets. If the rupturing force is not uniformly distributed, the imaging sheets develop unevenly and the tonal characteristics of the resulting images are not good.

As the width of the imaging sheets and the corresponding length of the calender rollers increases, the diameter of the rollers must also be increased to maintain sufficient stiffness such that pressure applied to the ends of the rollers is distributed evenly along the entire expanse of the rollers. As a general rule, the diameter of the rollers must be doubled as the length of the rollers is doubled in order to maintain sufficient stiffness. Thus, as the size of the imaging sheets increases, the cost and size of effective pressure-type development apparatus becomes prohibitive. In particular, while larger pressure rollers may be accommodated in developing apparatuses designed to develop relatively small copies, e.g., 8–12 inches in width, in certain applications, such as color proofing, large copy widths sometimes in excess of 36 inches are used. These copies are so large as to make it impractical to develop them using pressure rollers.

An additional drawback of processing imaging sheets by means of high pressure calender rollers is that some of the midtone quality of the developed images is lost. This is apparently due to a loss of a differential microcapsule rupture and is referred to as "midtone mottle". Thus, a number of difficulties have been encountered in designing calender rollers for pressure development of the aforementioned imaging sheets.

Alternate techniques for processing imaging sheets without bulky, high pressure calender rollers are known in the prior art. In commonly assigned U.S. Pat. No. 4,448,516, the imaging sheets are passed over a developer roll having a fibrous outer surface composed of interwoven natural or synthetic fibers or flexible bristles. The developer roll is rotated in contact with the imaging sheets to rupture the microcapsules on the sheets.

A second arrangement for generating shear forces for processing imaging sheets is disclosed in commonly assigned U.S. Pat. No. 4,578,340, and entitled "Free Particle Abrasion Development of Imaging Sheets Employing Photosensitive Microcapsules," wherein imaging sheets are contacted with a bed of free particles such that the free particles pass over the microcapsules on the surface of the imaging sheets to rupture the microcapsules. A third arrangement is disclosed in U.S. Pat. No. 4,592,986, and entitled "Magnetic Brush Abrasion Development of Imaging Sheets Employing Photosensitive Microcapsules," wherein imaging sheets are processed by contacting the imaging sheets with a traveling pile formed by magnetically attractable free particles on a magnetic brush.

Commonly assigned U.S. Pat. No. 4,648,699 describes the development of an imaging sheet containing microcapsules by moving a point contact which is resiliently biased into engagement with the imaging sheet across the entire surface of the sheet. Typically, the imaging sheet is secured to a cylinder and a point contact is positioned in resilient pressure contact with the imaging sheet. As the cylinder is rotated, the point contact is simultaneously moved along the cylinder in synchronism with the rotation of the cylinder to rupture the microcapsules and develop the image in the imaging sheet or the imaging sheet may be mounted on a planer platform and the point contact is moved across the surface of the sheet using an X–Y transport device. Also disclosed is an apparatus for developing a continuous web in which the point contact traverses the surface of the web in a circular path.

While these alternate processing arrangements each offer attractive features and may be preferred for selected applications, newer methods and devices which offer simpler and less expensive techniques for developing imaging sheets are desirable.

SUMMARY OF THE INVENTION

The present invention relates to a pressure developer apparatus for rupturing the microcapsules which form a photosensitive layer on the aforementioned imaging sheets by supporting an imaging sheet to be processed, providing a developer head containing at least one point contact element on a torsion arm in resilient engagement with the imaging sheet, and relatively oscillating the tension arm across the imaging sheet causing the point contact element to apply a uniform rupturing force to the imaging sheet thereby rupturing the microcapsules and forming an image on a support which is in intimate contact with the imaging sheet. The present invention represents a significant advancement over the prior art in general and over commonly assigned U.S. Pat. No. 4,648,699 in particular in that it is simpler and more cost effective, and provides better registration.

In one embodiment of the present invention, a tension arm developer apparatus oscillates around a fixed point to provide a plurality of arcuate paths, and the exposed imaging system is moved along a longitudinal path perpendicular to the arcuate paths of the oscillating tension arm developer apparatus so that the point contact element is resiliently biased into simultaneous bi-directional engagement with the surface of the imaging medium.

In another embodiment, the exposed imaging sheet is fixed in place and the tension arm developer apparatus is transported along a longitudinal path perpendicular to the arcuate paths formed by the oscillating tension arm developer apparatus so that the point contact element is resiliently biased into intimate contact with the imaging sheet.

In another embodiment of the invention, both the exposed imaging sheet and the tension arm developer apparatus are fixed in place and the developer head is movably employed along the shaft of the arm in synchronized motion with the oscillation of the arm so that point contact element is resiliently biased into intimate contact with the imaging sheet. In this embodiment, the developer head may move along the shaft of the arm in a stepped manner at the end of each oscillation so that the developer head traverses the imaging sheet along a plurality of arcuate paths or the movement of the developer head may be synchronized so that the developer head continuously traverses the imaging sheet in a plurality of linear paths which are perpendicular to the longitudinal axis of the imaging sheet.

In still another embodiment of the present invention, the tension exhibited by the point contact element positioned in the developer head on the oscillating tension arm is provided by a pressure means such as compressed air or a compression spring positioned so as to apply pressure on the point contact element along the oscillating paths.

In yet another embodiment, the uniform pressure is provided by the resilient spring tension or torque provided by a flexible tension arm.

Other advantages of the invention will be apparent from the following description, the accompanying drawings and the appended claims.

BRIEF DESCRIPTION OF THE DRAWINGS

FIG. 2 is a cross-sectional side view of the tension arm developer apparatus of the present invention;

FIGS. 3–5 are cross-sectional views of illustrative embodiments of point contact means which can be used in the present invention;

DETAILED DESCRIPTION OF THE INVENTION

Figure 1:
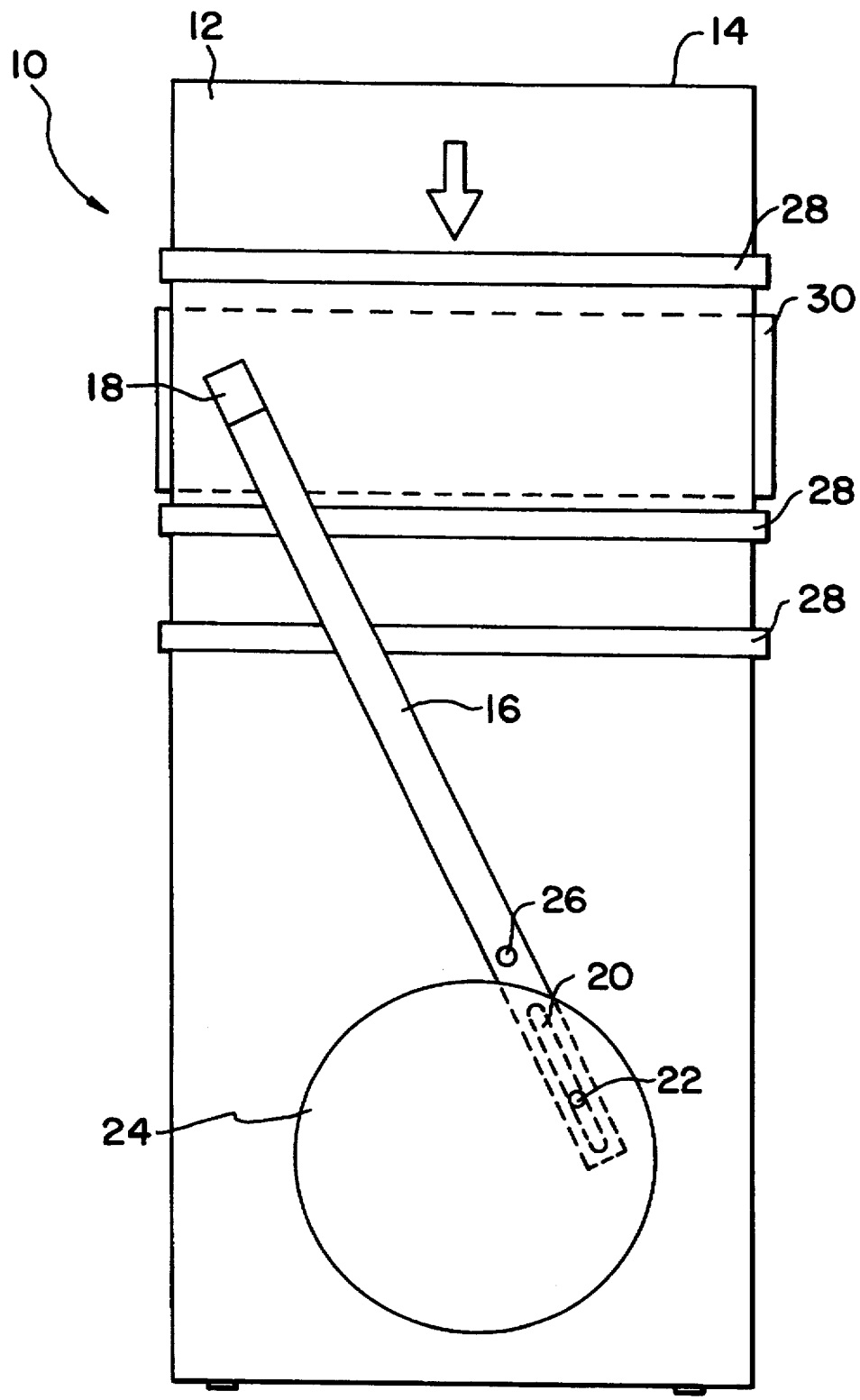
FIG. 1 is a top plan view of the tension arm developer apparatus of the present invention.

FIG. 1 and FIG. 2 illustrate a top plan view and a cross-sectional side view, respectively, of one embodiment of the present tension arm developer apparatus for developing an imaging sheet 14 in accordance with the invention. The apparatus 10 comprises a tension arm 16, a developer head 18 at the distal end of arm 16 containing a point contact element 36 which is in intimate contact with the surface 12 of the exposed imaging sheet 14, a slot 20 at the proximal end of the arm 16 for engaging a pin 22 on cam 24, a motor M for rotating the cam 24, and a vertical axle 26 about which arm 16 pivots causing the arm 16 to oscillate back and forth so that the point contact element 36 provides a plurality of arcuate paths across the upper surface 12 of an exposed imaging sheet 14. As the imaging sheet 14 is moved longitudinally through the apparatus 10 by means of driver rollers 28, the point contact element 36 moves across a surface 12 of the exposed imaging sheet 14 in a plurality of arcuate paths which traverse substantially the entire image area of exposed imaging sheet 14. The microcapsules are ruptured by pressure exerted on the exposed imaging sheet 14 by the point contact element 36 as the imaging sheet passes between the point contact element 36 and the developer plate 30 causing the internal phase to be image-wise released from the ruptured microcapsules where it reacts with the developer material 56 to form a visible image or the imaging sheet.

In accordance with one aspect of the invention, tension is exerted on the surface 12 of the exposed imaging sheet 14 by the point contact element 36 as a result of a downwardly resilient spring tension or torque in the tension arm 16. In another aspect of the invention, the tension is applied by a compression means illustrated in FIGS. 3 and 5 as a compression spring member 32 placed between the point contact element 36 and the support member 34 for the point contact element.

FIG. 3 shows in a cross-sectional illustration, the embodiment wherein the pressure exerted on the point contact element 36 is provided by a compression spring member 32 positioned in a sleeve 38. The point contact element 36 is retained in a socket 40 of support member 34. The support member 34 is slidingly retained in sleeve 38 by a retaining means 42 on sleeve 38 which fits into inset 44 so that the support 34 can move in a vertical direction and spring member 32 causes support 34 to be resiliently biased in a downwardly direction from arm 16.

In another embodiment of the invention, pressure is exerted on the surface of the exposed imaging sheet 14 by the point contact element 36 as a result of resilient spring tension or torque in a flexible tension arm. In this embodiment where the pressure is provided by a flexible arm, the developer head 18 may be a simple housing connected to the arm 16 wherein the support 34 retains a point contact element 36 in a receiving socket 40 as illustrated in FIG. 4. Similar mountings are used in ballpoint pens. If additional pressure is desired, a compression spring member or compressed air can be exerted upon the point contact element 36 as shown in FIG. 3 in conjunction with the flexible tension arm.

Generally a pressure load to be applied to the point contact element 36 is dependent upon both the type of substrate upon which the point contact element 36 rolls and upon the diameter of the point contact element 36 itself. It has been found that a pressure load of up to about 3 pounds on the point contact is sufficient to carry out the present invention and a load of about 1 to 1.6 pounds is preferred if the diameter of the point contact element 36 is ¼ inch and the substrate is a polyester film. If the diameter of the point contact element 36 is about ⅛ inch and the substrate is a polyester film, it is believed that the pressure load would decrease to about 0.5 pounds.

While the rotating ball point contact such as illustrated in FIGS. 3, 4, and 5 are preferred for use in the present invention, a solid device having a non-rotatable tip may be employed. Furthermore, it is within the scope of the present invention to use multiple rotatable or non-rotatable point contact elements resiliently biased into contact with the surface of the exposed imaging sheet to provide multiple paths across the surface of the sheet. In a particularly preferred embodiment, the multiple point contact elements are arranged so that each element provides a path which is parallel to and slightly off-set from the paths of adjacent elements. In this arrangement, the paths overlap to provide a much broader stripe for each oscillation of the element.

Figure 6:
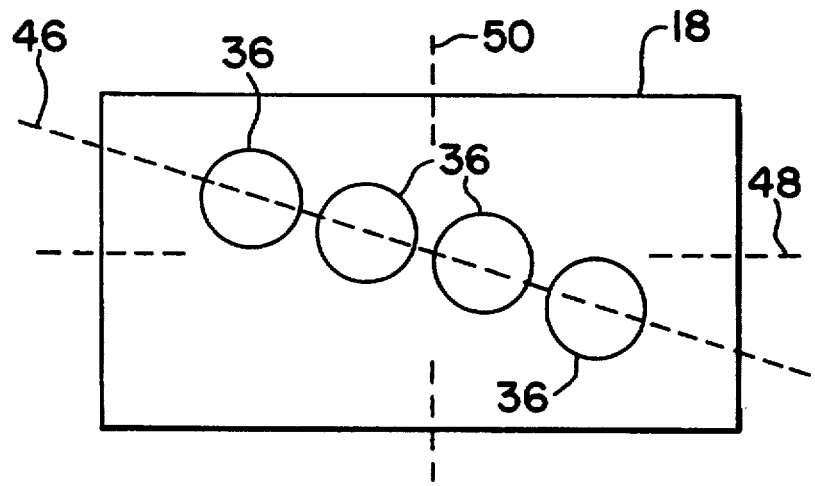
FIGS. 6–8 are top plan views of the developer head illustrating various configurations of the multiple point contact elements.
Figure 7:
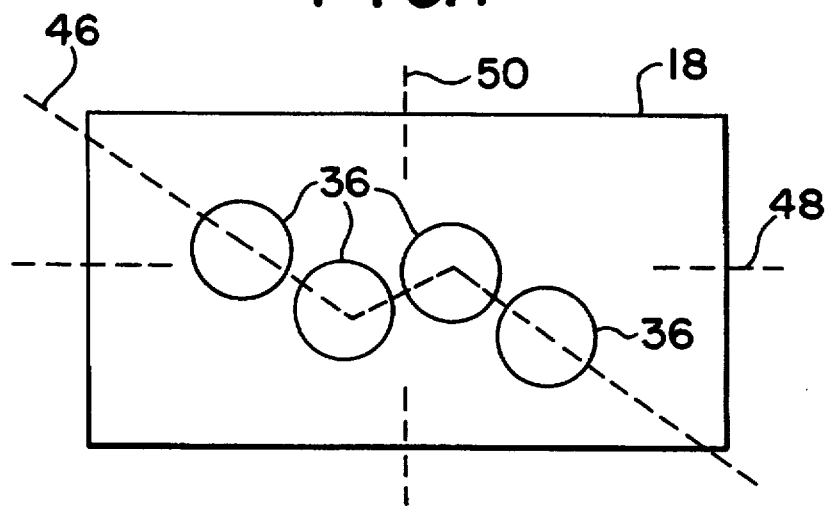
Figure 8:
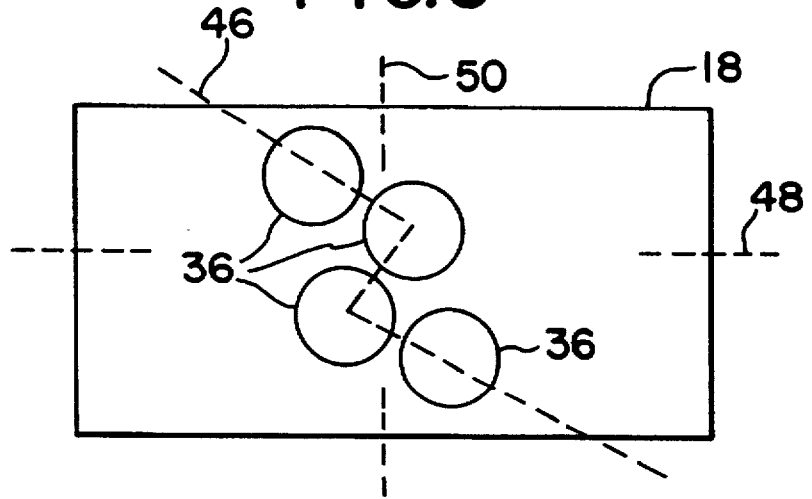

FIG. 6 illustrates the arrangement of spherical point contact elements 36 in which the elements 36 are aligned in a linear line 46 which is slightly oblique with respect to the lateral axis 48 of the developer head 18. In FIGS. 7 and 8, the arrangement of point contact elements 36 is illustrated by non-linear lines 48 which are arranged in zigzag configurations along the lateral axis 48 and the longitudinal axis 50 of the developer head 16, respectively. Other configurations are possible such as a circular arrangement of the point contact elements with respect to the applicator head.

The point contact element which is preferred in the present invention is a bearing or ball which rotates freely in a receiving socket 40 where it provides a sufficient pressure to rupture the microcapsules in the imaging sheet. The point contact element is made from any hard material such as metal, e.g. steel, brass, etc.; ultra high molecular weight polymer, e.g., UHMW polyethylene; and the like. Particularly good results have been achieved using a point contact element made of brass. The size of the point contact element is not critical; however, it has been found that a preferred range of the ball size would be between about 1/32 inch and 1/2 inch while the most preferred diameter of the ball would be about 1/8 inch.

In the preferred aspect of the invention, the spherical point contact element is free to rotate in any direction within the socket. However, as illustrated in FIG. 7, the spherical point contact element 36 is supported on an axle 52 and is therefore limited to either forward or backward rotation. For the purpose of illustration, the pressure exerted in FIG. 5 is by a spring member, but such pressure could be provided by a pneumatic pressure system using air as the pressurizing agent, or the pressure may be provided by spring tension or torque such as that resulting from a flexible arm.

In order for the developer apparatus 10 to be resiliently biased into simultaneous bi-directional engagement with the surface of the exposed imaging sheet, it is necessary to move either the imaging sheet or the developer apparatus in a longitudinal direction essentially perpendicular to the oscillation of the tension arm. In a preferred embodiment, it is the exposed imaging sheet 14 which is transported in accordance with the present invention, the direction of movement being in the direction of the arrow as shown in FIG. 1. The exposed imaging sheet 14 is moved across a developer plate 30 by rubber coated rollers 28. As the exposed imaging sheet 14 is transported between the spherical point contact element 36 and the developer plate 30, the tension arm 16 is oscillated transversely by the rotating cam 24. The movement of the spherical point contact element 36 across either the top surface or bottom surface of the exposed imaging sheet 14 creates a pressure stripe along the path of travel which causes development of a small section of the image corresponding to the pressure stripe. As the cam continues revolving, the tension arm 16 is moved in the opposite direction producing a pressure stripe which overlaps the previous stripe, preferably by about 10 to 30% and most preferably by about 18%. The exposed imaging sheet 14 can be moved across the developer plate 30 continuously or it can be moved in specific increments until the entire exposed imaging sheet is developed.

The imaging sheet described above has been characterized as an exposed imaging sheet and it typically would be employed as such, however, the use of an exposed imaging sheet is not necessary in the practice of the invention.

While a variety of embodiments have been disclosed for performing point contact development, many other arrangements will be apparent to those skilled in the art after a review of the above disclosure.

Having described the invention in detail and by reference to preferred embodiments thereof, it will be apparent that modifications and variations are possible without departing from the scope of the invention defined in the appended claims.

What is claimed is:

1. A pressure developing apparatus for use in developing images in the image area of a photosensitive imaging sheet containing microcapsules, said apparatus comprising:

a developer head comprising at least one point contact element, said point contract element being biased into contact with a surface of said imaging sheet;

a drive mechanism coupled to said developer head to oscillate said developer head across the surface of said imaging sheet; and means for establishing longitudinal movement between said developer head and said imaging sheet, wherein said developer head oscillates across the surface of said imaging sheet and said at least one point contact element applies uniform pressure along a plurality of paths across the surface of said imaging sheet sufficient to rupture said microcapsules in substantially the entire image area, said at least one point contact element being a spherical element having a diameter of about 1/32 inch to about 1/2 inch, and said uniform pressure corresponding to a load of about 0.5 to 3 pounds.

2. The apparatus of claim 1 wherein said drive mechanism includes an arm and means for oscillating said arm across the surface of said imaging sheet.

3. The apparatus of claim 2 wherein said developer head is positioned along said arm.

4. The apparatus of claim 2 wherein said means for oscillating said arm causes pivotal movement of said arm and arcuate movement of said developer head.

5. The apparatus of claim 1 wherein said spherical element is mounted for rotation in an appropriate receiving socket located in said developer head, whereby point contact is made by said spherical element as it rotates within said socket and over the surface of said imaging sheet.

6. The apparatus of claim 1 wherein said spherical element has a diameter of about 1/8 inch.

7. The apparatus of claim 6 wherein said uniform pressure corresponds to a load of about 1 to 1.6 pounds on said point contact.

8. The apparatus of claim 2 wherein said arm ms mounted with respect to said imaging sheet such that there is downwardly acting tension in the arm which resiliently biases said point contact element into continuous engagement with the top surface of said imaging sheet.

9. The apparatus of claim 1 wherein said developer head further comprises a pressure means which acts on said point contact element and resiliently biases said point contact element into continuous engagement with the surface of said imaging sheet.

10. The apparatus of claim 9 wherein said pressure means comprises a compression spring.

11. The apparatus of claim 9 wherein said pressure means comprises a source of air pressure.

12. The apparatus of claim 1 wherein said contact point element is connected to said developer head on an axle.

13. The apparatus of claim 1 wherein said imaging sheet is moved intermittently at the end of each oscillation of said developer head along a linear longitudinal path perpendicular to the paths formed by said point contact element so that said point contact element is resiliently biased into simultaneous bi-directional engagement with the surface of said imaging sheet wherein uniform pressure is applied to substantially the entire image area.

14. The apparatus of claim 13 wherein said paths overlap.

15. A pressure developing apparatus for use in developing images in the image area of a photosensitive imaging sheet containing microcapsules, said apparatus comprising:

a developer head comprising a plurality of point contact elements, said point contact elements being biased into contact with a surface of said imaging sheet;

a drive mechanism coupled to said developer head to oscillate said developer head across the surface of said imaging sheet; and means for establishing longitudinal movement between said developer head and said imaging sheet, wherein said developer head oscillates across the surface of said imaging sheet and said point contact elements apply uniform pressure along a plurality of paths across the surface of said imaging sheet sufficient to rupture said microcapsules in substantially the entire imaging area, said plurality of point contact elements being arranged so that each element provides a path which is parallel to and slightly off-set from the paths of adjacent elements.

16. The apparatus of claim 15 wherein said plurality of point contact elements are arranged along a linear line.

17. The apparatus of claim 15 wherein said plurality of point contact elements are arranged along a non-lineal line.

18. A pressure developing apparatus for use in developing images in the image area of a photosensitive imaging sheet containing microcapsules, said apparatus comprising:

an arm which oscillates across the surface of said imaging sheet;

means for oscillating said arm across the surface of said imaging sheet, means for establishing longitudinal movement between said arm and said imaging sheet; and a developer head positioned along the shaft of said arm, said developer head further comprising at least one point contact element, said point contact element being resiliently biased into contact with a surface of said imaging sheet, wherein said developer head oscillates across the surface of said imaging sheet and said at least one point contact element applies uniform pressure along a plurality of arcuate paths across the surface of said imaging sheet sufficient to rupture said microcapsules in substantially the entire image area;

wherein said means for oscillating said arm across the surface of said imaging sheet comprises a cam.

19. The apparatus of claim 18 wherein said arm is mounted on a pivot means perpendicular to the surface of said imaging sheet, said arm including a slot at the proximal end thereof for engaging a pin on said cam.

20. A pressure developing apparatus for use in developing images in the image area of a photosensitive imaging sheet containing microcapsules, said apparatus comprising:

an arm which oscillates across the surface of said imaging sheet;

means for oscillating said arm across the surface of said imaging sheet;

means for establishing longitudinal movement between said arm and said imaging sheet; and a developer head positioned along the shaft of said arm, said developer head further comprising at least one point contact element, said point contact element being resiliently biased into contact with a surface of said imaging sheet, wherein said developer head oscillates across the surface of said imaging sheet and said at least one point contact element applies uniform pressure along a plurality of arcuate paths across the surface of said imaging sheet sufficient to rupture said microcapsules in substantially the entire imaging area, said developer head being disposed toward the distal end of said arm.

21. A pressure developing apparatus for use in developing images in the image area of a photosensitive imaging sheet containing microcapsules, said apparatus comprising:

an arm which oscillates across the surface of said imaging sheet;

means for oscillating said arm across the surface of said imaging sheet;

means for establishing longitudinal movement between said arm and said imaging sheet; and a developer head positioned along the shaft of said arm, said developer head further comprising at least one point contact element, said point contact element being resiliently biased into contact with a surface of said imaging sheet, wherein said developer head oscillates across the surface of said imaging sheet and said at least one point contact element applies uniform pressure along a plurality of arcuate paths across the surface of said imaging sheet sufficient to rupture said microcapsules in substantially the entire image area, said developer head being movably employed along the shaft of said arm wherein the movement of said developer head along said shaft is synchronized with the oscillation of said arm such that said at least one point contact element applies a uniform pressure along a plurality of linear paths.

* * * * *